United States Patent
Bailey et al.

(10) Patent No.: US 11,839,903 B2
(45) Date of Patent: Dec. 12, 2023

(54) VACUUM PUMPING SYSTEM

(71) Applicant: Edwards Limited, Burgess Hill (GB)

(72) Inventors: Christopher Mark Bailey, Burgess Hill (GB); Michael Roger Czerniak, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 1084 days.

(21) Appl. No.: 16/608,046

(22) PCT Filed: Apr. 4, 2018

(86) PCT No.: PCT/GB2018/050906
§ 371 (c)(1),
(2) Date: Oct. 24, 2019

(87) PCT Pub. No.: WO2018/197834
PCT Pub. Date: Nov. 1, 2018

(65) Prior Publication Data
US 2020/0047225 A1    Feb. 13, 2020

(30) Foreign Application Priority Data
Apr. 28, 2017 (GB) .................... 1706787

(51) Int. Cl.
*F04D 13/00* (2006.01)
*B08B 15/02* (2006.01)
(Continued)

(52) U.S. Cl.
CPC .............. *B08B 15/02* (2013.01); *B01D 53/64* (2013.01); *B01F 23/191* (2022.01);
(Continued)

(58) Field of Classification Search
CPC ...... B08B 15/02; B01F 23/191; B01F 35/718; B01F 35/2312; B01D 53/64; F04D 13/12; G03F 7/70933; H01L 21/67017
See application file for complete search history.

(56) References Cited

U.S. PATENT DOCUMENTS
2021/0106955 A1    4/2021 Matsushima et al.

FOREIGN PATENT DOCUMENTS
CN          1957182 A      5/2007
CN        101341336 A      1/2009
(Continued)

OTHER PUBLICATIONS

British Search Report dated Oct. 13, 2017 and Examination Report dated Oct. 16, 2017 for corresponding British Application No. GB1706787.7.
(Continued)

*Primary Examiner* — Kevin R Barss
(74) *Attorney, Agent, or Firm* — Theodore M. Magee; Westman, Champlin & Koehler, P.A.

(57) ABSTRACT

A vacuum pumping system which comprises a plurality of vacuum pumping arrangements for evacuating a flammable gas stream and exhausting the gas stream through an exhaust outlet. A housing houses the vacuum pumping arrangements and forms an air flow duct for an air flow for mixing with the exhaust gas stream output from the exhaust outlet in a mixing region in the housing. An airflow generator generates an air flow through the air flow duct to cause mixing of air with the flammable gas stream to a percentage of the flammable gas in the air flow lower than the lower flammability limit of the flammable gas. An airflow sensor senses the flow of air for determining if the air flow is sufficient to dilute the flammable gas to lower than said percentage.

24 Claims, 6 Drawing Sheets

(51) Int. Cl.
  *G03F 7/00* (2006.01)
  *B01D 53/64* (2006.01)
  *H01L 21/67* (2006.01)
  *B01F 23/10* (2022.01)
  *B01F 35/71* (2022.01)
  *B01F 35/21* (2022.01)
  *B01F 35/221* (2022.01)
  *F04D 13/12* (2006.01)

(52) U.S. Cl.
  CPC ...... *B01F 35/2111* (2022.01); *B01F 35/2132* (2022.01); *B01F 35/2211* (2022.01); *B01F 35/718* (2022.01); *F04D 13/12* (2013.01); *G03F 7/70916* (2013.01); *G03F 7/70933* (2013.01); *H01L 21/67017* (2013.01); *F04D 13/00* (2013.01)

(56) References Cited

FOREIGN PATENT DOCUMENTS

| | | |
|---|---|---|
| CN | 104995406 A | 10/2015 |
| EP | 0038410 A2 | 10/1981 |
| EP | 2811161 A1 | 12/2014 |
| JP | H05180166 A | 7/1993 |
| JP | 2004507641 A | 3/2004 |
| JP | 2010517769 A | 5/2010 |
| JP | 4673011 B2 | 4/2011 |
| JP | 2014227968 A | 12/2014 |
| JP | 2015227618 A | 12/2015 |
| WO | 9904325 A1 | 1/1999 |
| WO | 2005093260 A1 | 10/2005 |
| WO | 2006095132 A1 | 9/2006 |
| WO | 2006097679 A1 | 9/2006 |
| WO | 2009044197 A2 | 4/2009 |
| WO | 2011121322 A2 | 10/2011 |
| WO | 2012127198 A2 | 9/2012 |
| WO | 2016110694 A1 | 7/2016 |
| WO | 2017013383 A1 | 1/2017 |

OTHER PUBLICATIONS

PCT Notification of Transmittal of the International Search Report and the Written Opinion of the International Searching Authority, or the Declaration dated Jun. 21, 2018, PCT Search Report and Written Opinion dated Jun. 21, 2018 for corresponding PCT Application No. PCT/GB2018/050906.

Notification of Reason for Rejection dated May 19, 2022 for corresponding Japanese application Serial No. 2019-556896, 9 pages.

First Office Action dated Jul. 28, 2020 for corresponding Chinese application Serial No. 201880027966.0.

VACUUM PUMPING SYSTEM

CROSS-REFERENCE OF RELATED APPLICATION

This application is a Section 371 National Stage Application of International Application No. PCT/GB2018/050906, filed Apr. 4, 2018, and published as WO 2018/197834 A1 on Nov. 1, 2018, the content of which is hereby incorporated by reference in its entirety and which claims priority of British Application No. 1706787.7, filed Apr. 28, 2017.

FIELD

The present invention relates to a vacuum pumping system.

BACKGROUND

Vacuum pumping systems are used extensively in vacuum processing, particularly in semiconductor fabrication facilities. Lithography is one such semiconductor fabrication process, in which semiconductor products are manufactured by controlled exposure to a source of radiation. The source of radiation may be ultraviolet or extreme ultraviolet radiation. The source of radiation and the processing tools of the fabrication facility require vacuum pressures in the presence of selected gases, and vacuum pumping systems provide evacuation of these gases at the vacuum pressures that are required.

The discussion above is merely provided for general background information and is not intended to be used as an aid in determining the scope of the claimed subject matter. The claimed subject matter is not limited to implementations that solve any or all disadvantages noted in the background.

SUMMARY

The present invention provides a vacuum pumping system comprising: a plurality of vacuum pumping arrangements for evacuating a flammable gas stream and exhausting the gas stream through one or more exhaust outlets; a housing for housing the vacuum pumping arrangements and forming an air flow duct for an air flow for mixing with the exhaust gas stream output from the one or more exhaust outlets in a mixing region in the housing; an airflow generator for generating an air flow through the air flow duct to cause mixing of air with the flammable gas stream to a percentage of the flammable gas in the air flow lower than the lower flammability limit of the flammable gas; and an air flow sensor for sensing the flow of air for determining if the air flow is sufficient to dilute the flammable gas to lower than said percentage.

The housing may comprise a first region at lower pressure and a second region at higher pressure and the air flow duct is formed by the second region.

The vacuum pumping arrangements may comprise a plurality of vacuum pumps and the first region houses the upstream vacuum pumps and the second region houses the downstream vacuum pumps.

There may be at least two said air flow sensors, one of which is upstream of the vacuum pumping arrangement and one of which is downstream of the vacuum pumping arrangements.

The system comprises a control and wherein the or each air flow sensor may be configured to output a signal relating to the sensed air flow to the control for determining if the air flow is sufficient to dilute the flammable gas to lower than said percentage.

In one example, the second region of the housing comprises an air inlet and an air outlet for the air flow duct, and a mixing region is located at the air outlet, the one or more exhaust outlets for the gas stream being located in the mixing region for mixing the air flow with the gas stream prior to passage through the air outlet. The mixing region may space the exhaust outlets from the air outlet by a distance sufficient to allow mixing of the flammable gas with the air flow to lower than the lower flammability limit prior to emission through the air outlet. The mixing region may comprise a baffle arrangement for mixing the flammable gas with the air flow.

The exhaust outlets may be arranged to exhaust the gas stream in a direction generally transverse to the air flow for dispersing the flammable gas in the air stream.

The second region of the housing may be arranged to be free of potential ignition sources.

The second region may be configured for directing air flow to potential leakages of flammable gas.

Tin traps may be provided for collecting Tin in the gas stream.

There may be at least one sensor for sensing oxygen in the exhaust stream, the sensors being located downstream of the vacuum pumping arrangements with respect to flow of the gas stream and upstream of the one or more exhaust outlets with respect to the air flow sufficiently to prevent oxygen in the air flow migrating upstream through the exhaust outlets to the oxygen sensors.

There may be a hydrogen recovery system for receiving the gas stream from the vacuum pumping arrangements and recovering hydrogen from the gas stream, wherein the air flow duct is arranged for ducting air flow around the hydrogen recovery, system for diluting leakages of hydrogen.

There may be provided a common exhaust line connected for receiving exhaust gas from the plurality of vacuum pumping arrangements.

A common vacuum pump may be provided for pumping exhaust gas conveyed along the common exhaust line for reducing pressure at the exhausts of the vacuum pumping arrangements.

An oxygen sensor may be located for sensing oxygen content of the gas stream in the common exhaust line upstream of the common vacuum pump at a pressure less than atmosphere.

In some embodiments, the plurality of vacuum pumping arrangements comprise a plurality of vacuum pumps housed within a vacuum pumping region, said vacuum pumping region comprising said air flow duct and comprising a plurality of air inlets for admitting air adjacent to the downstream vacuum pumps and a plurality of orifices for outputting air adjacent to the upstream vacuum pumps.

In some cases the air flow duct may comprise the housing housing all of the vacuum pumps such that air flows from the downstream side of the housing to the upstream side of the housing, collecting any gas leaking from the pumps as it flows. This arrangement allows maintenance of the individual pumping stacks without the need to stop the whole system as the housing can be opened to access the pumps and flow will continue to flow from the clean room over the pumps and out through the orifices. This arrangement is also more suitable for retrofitting to an existing system, allowing an existing system to be fitted with an air flow system that allows any flammable gas to be diluted to below a flammable limit.

In some embodiments, said plurality of orifices are configured to output air flow to an air flow passage, said air flow duct further comprising said air flow passage.

Having an air flow passage downstream of orifices B allows the air to flow in a controlled manner from these orifices to the further parts of the system, which passage helps to direct and isolate the flow during pumping stack maintenance.

In some embodiments, said plurality of orifices comprise controllable orifices configured to vary a diameter of said orifice in response to a control signal.

It may be desirable to have controllable orifices between the air flow passage and the pump housing. This allows the air flow distribution over the pumps to be controlled.

In some embodiments, the system further comprises a plurality of air flow sensors each associated with at least a subset of said plurality of orificies and a further air flow sensor adjacent to the mixing region.

Having air flow sensors associated with at least a subset of the orifices allows the flow distribution through the pump housing to be determined. Where the system has controllable orifices, then the air flow distribution can be controlled by control circuitry adjusting the size of the controllable orifices in response to readings from the air flow sensors.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

In order that the invention may be well understood, embodiments thereof, which are given by way of example only, will now be described in more detail, with reference to the accompanying drawings, in which:

FIG. 3 is a schematic view of yet another vacuum pumping system;

DETAILED DESCRIPTION

Before discussing the embodiments in any more detail, first an overview will be provided.

Previously abatement may have involved burning hydrogen or other flammable gases exhausted from the apparatus. This method is generally acceptable, but burning produces waste heat. Additionally, a fuel gas, such as methane, may be required to ensure complete combustion, and the provision of a fuel gas adds to the cost of abatement. It is desirable to dispose of these flammable gases using methods other than burning. Where the gases are for example, hydrogen, oxygen and nitrogen and there are no toxic gases such as HBr, then these gases are all "air gases" which can be discharged into the atmosphere. Where there are other substances such as Tin present, then these can be trapped these before they reach the abatement point.

Hydrogen for example is highly dispersive and can be released to atmosphere without significant environmental impact provided it is sufficiently diluted so that it does not cause a flammability risk. Discharging the gases with diution rather than combustion is greener and more robust than combustion.

Further advantages of such a system that dilutes rather than combusts include: the availability of air and the lack of dependency on fuel gas availability. Furthermore, such a system is relatively insensitive to flow during pump down and to low hydrogen flow rate. Furthermore, there is no dependence on extract pressure From an environmental point of view, there is no increase in air flow from clean room, no requirement to produce methane, no methane combustion by-products, no combustion heat to be removed.

From a utility cost point of view, there is no fuel cost and air movement costs are not increased.

Regarding heat removal where hydrogen is burnt then this must be removed. Embodiments, reduce the carbon footprint significantly where the fab is powered by fossil fuel when compared to systems where hydrogen is combusted.

Figure 1:
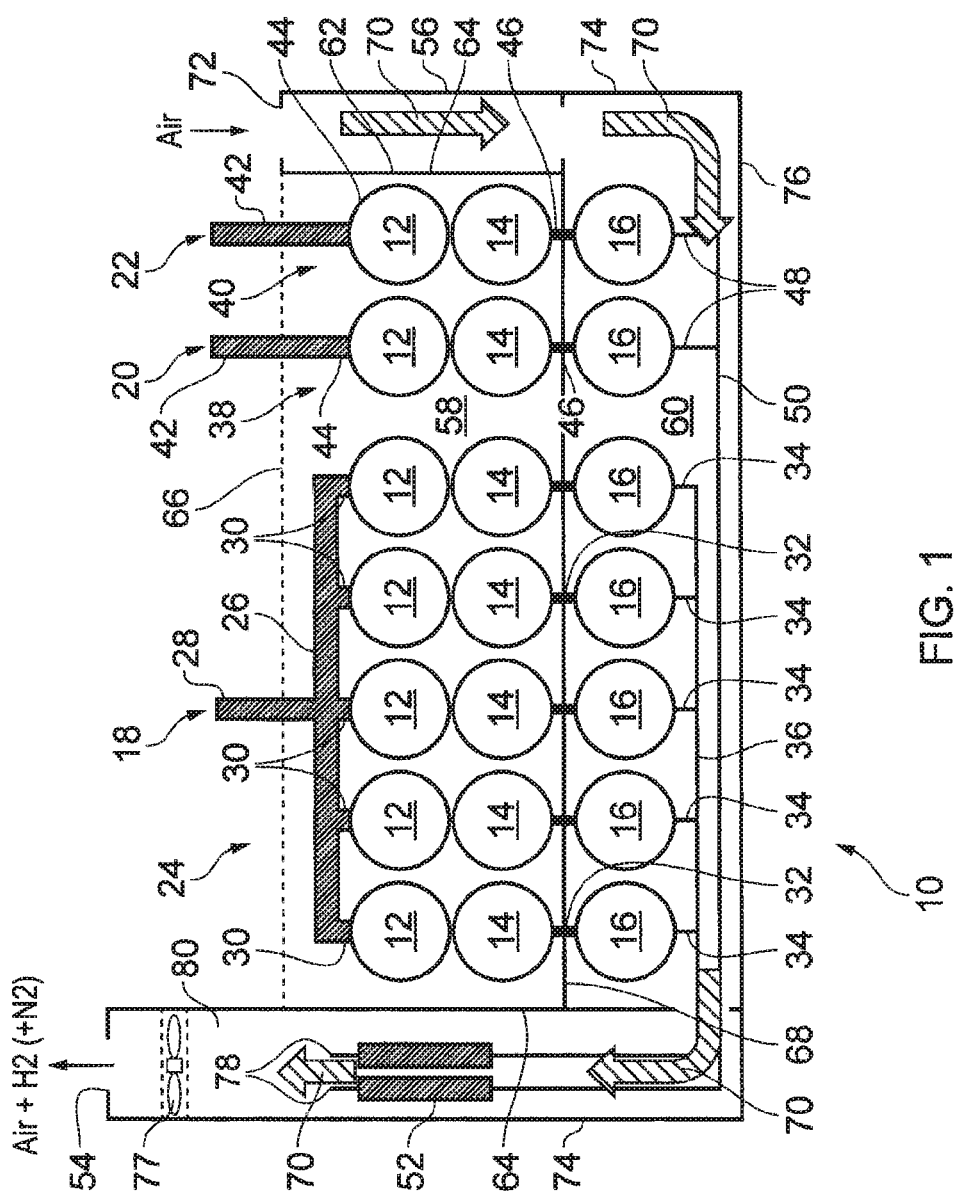
FIG. 1 is a schematic view of a vacuum pumping system.

Referring to FIG. 1 there is shown a vacuum pumping system 10 for evacuating a gas from one or more chambers or enclosures (not shown). The vacuum pumping system is configured for evacuating a flammable gas from a semiconductor fabrication or processing apparatus and in particular for evacuating hydrogen from an extreme ultraviolet (EUV) lithography apparatus.

In known EUV lithography apparatus there is a source chamber which generates EUV radiation. The EUV radiation is used for processing of silicon wafers in an exposure or scanner chamber. The source generates EUV radiation by energising Tin with a high energy laser in a hydrogen atmosphere at low pressure (e.g. 1 mbar). The laser vapourises most of the tin which is then available to react with the hydrogen to form stannane. Some of the tin remains in droplet form and is captured. Most of the hydrogen remains elemental and requires evacuation from the source. The generation of EUV radiation requires significant quantities of hydrogen, for example 400 standard litres per minute (slm). The exposure chamber also requires hydrogen but at a lower flow rate in the region of 20 slm.

Hydrogen is the lightest element and is difficult to pump and therefore is mixed with an inert gas such as nitrogen either upstream of or within the vacuum pumping system to improve pumping. The amount of nitrogen introduced to the flow stream is about the same as the amount of hydrogen by volume (about 1:1) sufficient to achieve effective pumping of hydrogen, but more or less nitrogen may be used depending on the particular pumping arrangements and other requirements.

In vacuum pumping systems for evacuating these flammable gases the required pumping characteristics depend on such things as the processes being performed in one or more process chambers and the process gases used. The pumping characteristics include, amongst other parameters, pressure and flow (or pumping speed/capacity) for the or each process chamber. These pumping characteristics are achieved by selecting the number of vacuum pumping arrangements, the number of pumps in each vacuum pumping arrangement, the configuration of pumps within a vacuum pumping arrangement and the type of pumping mechanism used for pumping.

More specifically, the vacuum pumping system may comprise a single vacuum pumping arrangement or a plurality of vacuum pumping arrangements. In the illustrated example there are seven vacuum pumping arrangements shown. Each vacuum pumping arrangement may comprise a single vacuum pump or more than one pump configured in series and/or parallel. In the illustration, each vacuum pumping arrangement comprises three pumps in series 12, 14, 16. The pump or pumps selected may comprise without limitation any one or more of the following vacuum pumping mechanisms: turbo molecular, drag, scroll, screw, roots, claw or rotary vane.

In the example of FIG. 1 for an EUV apparatus, the vacuum pumping arrangements comprise in series two booster pumps 12, 14, and a primary (or backing) pump 16. The primary pump is a compression pump configured for generating a significant portion of the required vacuum pressure in the upstream source, which is typically in the region of 1 mbar, and the booster pumps are configured for generating the required volumetric flow, which for a source is in the region of 100 slm per tool. In this example, the booster pumps 12, 14 comprise roots type mechanisms and the primary pump comprises a claw type mechanism. There are many other pump configurations and arrangements that could be used depending on the flow and pressure required.

In FIG. 1 the vacuum pumping arrangements are grouped to evacuate three pumped gases 18, 20, 22. In other examples the vacuum pumping system is arranged to evacuate fewer or more than three pumped gas flows. In an EUV fabrication facility, the process gas flow 18 is the source and the process gas flows 20, 22 are the exposure, or scanner. There may be one or more source chambers and one or more exposure chambers.

A first group 24 of a plurality of vacuum pumping arrangements is configured for evacuating gas flow 18. Five vacuum pumping arrangements are shown in FIG. 1 in group 24. The vacuum pumping arrangements are arranged in parallel and each comprises three vacuum pumps 12, 14, 16 in series. A manifold 26 conveys process gas received by an inlet line 28 from one or more source tools to inlets 30 of the first pump 12 of the vacuum pumping arrangements. Gas is pumped by first pumps 12 and second pumps 14 and forelines 32 convey gas from the exhausts of the second pumps to an inlet of the third pumps 16. The third pumps pump gas to exhausts 34 that are connected by exhaust lines 34 to a first common exhaust line 36.

Vacuum pumping arrangements 38, 40 are arranged to evacuate respective process gas flows 20, 22, which in the example of a EUV apparatus are from respective exposure apparatus. Each of these vacuum pumping arrangements comprises three vacuum pumps 12, 14, 16 in series. Gas lines 42 convey process gas 20, 22 from respective process chambers (not shown) to the inlets 44 of the first vacuum pumps 12 for pumping by the first and second vacuum pumps 12, 14. Forelines 46 convey gas from an exhaust of the second vacuum pump to inlets of the third vacuum pumps 16. Exhaust lines 48 convey gas from the exhausts of vacuum pumps 16 to a second common exhaust line 50.

The first and second common exhaust lines 36, 50 convey gas through silencers 52 to be expelled from the system 10 through opening 54.

The vacuum pumping system 10 comprises a housing 56. The housing forms a first region 58 and a second region 60. As explained in more detail below, the first region houses those parts of the vacuum pumping arrangements which pump gas at a lower, or vacuum, pressure (e.g. 1 mbar) and the second region houses those parts of the vacuum pumping arrangements which pump gas at higher, or atmospheric pressure (e.g. 1 bar). The first region 58 and the second region 60 are substantially sealed one from another sufficiently to resist harmful leakage of gases between the regions, particularly of pumped or flammable pumped gases, such as hydrogen.

The first region is defined by an enclosure 62 of the housing for enclosing first and second vacuum pumps 12, 14 and comprises openings for conveying gas to and from the vacuum pumps. The enclosure as shown comprises sides 64, a lower part 66 and an upper part 68 (shown in broken lines). The upper part comprises openings through which gas inlets 28, 42 extend for conveying gas to the vacuum pumps 12, 14. Gas-tight seals seal between the gas inlets and the upper part. The lower part comprises openings through which forelines 32, 46 extend for conveying gas from the vacuum pumps 12, 14 to the vacuum pumps 16. Gas-tight seals seal between the forelines and the lower part.

The second region 60 is defined by a flow path of the housing along which gas can flow as shown by arrows 70 from an inlet 72 to the outlet 54. The flow path encloses the third vacuum pump 16, exhaust lines 34, 48 and common exhaust lines 36, 50. The flow path is defined by sides 74, the part 68 and a lower part 76. Air is conveyed through inlet 72 along the flow path 70 where it mixes with process gas and is exhausted through outlet 54 for containment or release.

Air flow 70 is generated by a pump 77, such as a turbine or other source of air flow. It is preferable to locate the generator so that it draws air along the path and is therefore located downstream rather than pushing the air from upstream. In this example the pump 77 is located upstream of the outlets 78.

The pressure of pumped gas increases as it is pumped through the pumps 12, 14, 16 and is more prone to leakage out at higher pressures, especially as in the present example where the third pumps 16 generate the majority of compression. The second region 60 encloses the higher pressure portions of the pumping lines so that leakages out of pumped gas from the vacuum pumps 16 or from the exhaust lines or common exhaust lines, or their fittings, are swept into the air flow. When the pumped gas is hydrogen, which is flammable the air flow dilutes leaked hydrogen to avoid concentrations of hydrogen above its lower flammability limit.

The first and second common exhaust lines 36, 50 have outlets 78 for exhausting pumped gas. The arrangement of these outlets with the flow of air causes mixing of the pumped gas with the air to avoid concentrations of hydrogen above its lower flammability limit. In the illustration, the outlets 78 are spaced upstream from outlet 54 of the housing with respect to the direction of the flow path 70 sufficiently to allow gas mixing in region 80 prior to emission from the housing through the opening. Depending on the flow rates of pumped gas and air, this arrangement causes mixing of gases so that the pumped gas has a percentage in air below its lower flammability limit. In the case of hydrogen, which is a highly dispersive gas, the region 80 may be as little as a one or two metres for mixing to be achieved prior to release, although in practice the pipe length may be more than five metres for a chimney.

Figure 2:
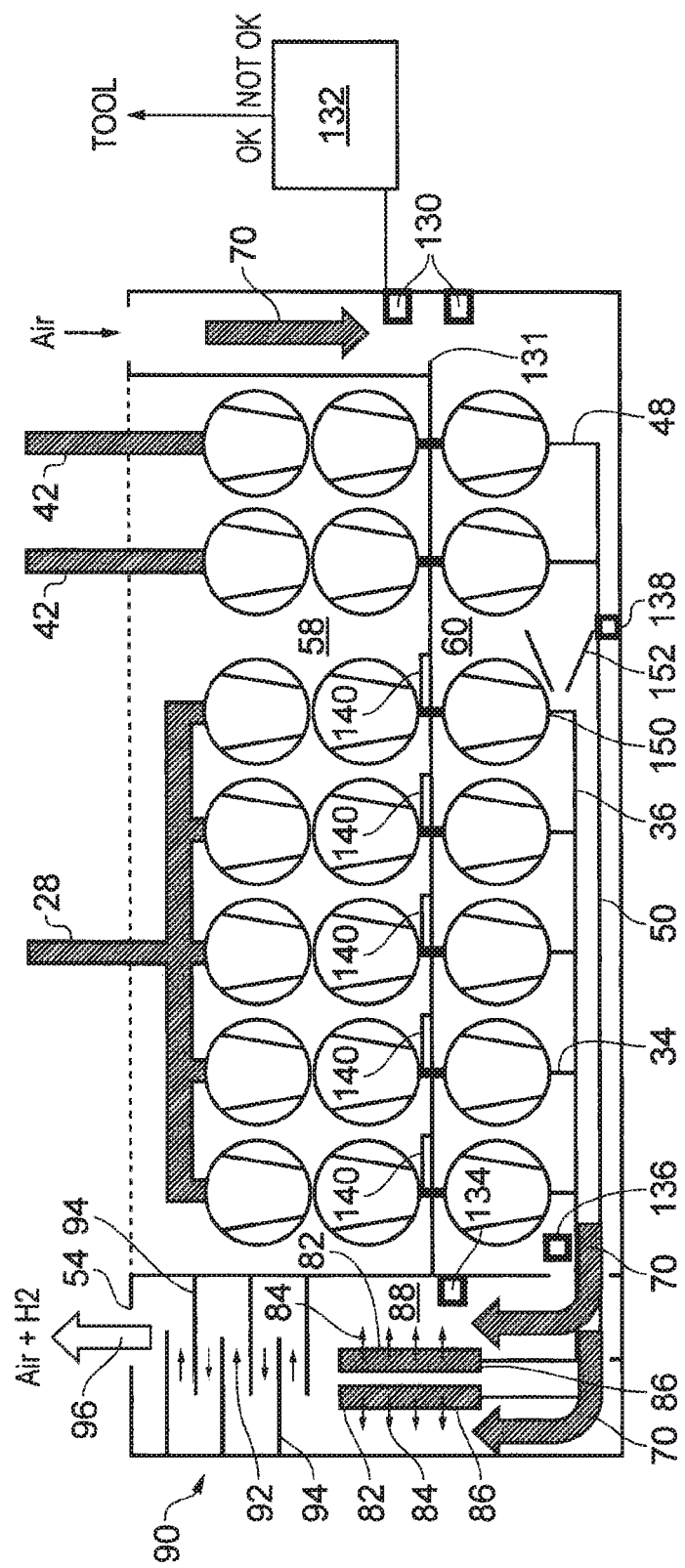

A modification of the mixing arrangement is shown in FIG. 2. FIG. 2 is similar to FIG. 1 except for the differences described below. The similarities will not be described again to avoid repetition.

In FIG. 2, the first common exhaust line 36 and the second common exhaust line 50 each have a plurality of outlets 82 through which pumped gas 84 is exhausted, as shown by the eight horizontal arrows. In this example each common exhaust line comprises four outlets 82, although any number may be selected. The outlets are conveniently formed as part of the silencer mechanisms 86. The air flow 70 is arranged to flow in close proximity to the outlets 82 and advantageously in a direction which is generally transverse or perpendicular to pumped gas flow 84 to promote diffusion, mixing and dispersion of the process gas in the air flow in region 88.

A baffle arrangement 90 causes mixing or further mixing of the pumped gas in the air. The baffle arrangement defines a tortuous or labyrinthine flow path 92 between baffle walls 94. Mixed gas 96 is emitted from the housing through opening 54.

In addition or alternative to a baffle arrangement, other types of mixing arrangement may be incorporated in the vacuum pumping system. For example, the pumped gas may be passed through a throttle or restricted orifice, whereby the pumped gas subsequently expands and disperses into the air flow.

The mixing method and chamber 80 adopted is free of potential sources of ignition at least in those regions where there is a possibility that the flammable pumped gas is at a percentage in air above its lower flammability limit.

When a flammable gas is used in a process, for example hydrogen in an EUV application, it may be desirable to determine the amount of oxygen in the process gas stream, since it is the mixture of flammable gas with oxygen that causes potentially problems. An oxygen sensor may be used to detect the amount of oxygen in the process gas stream and to output a signal relating to the oxygen content. The signal may be used for to terminate operation of the process.

Typically an oxygen sensor functions with improved integrity at higher pressures close to atmosphere and therefore is desirably located downstream of the vacuum pumping arrangements. In FIG. 2 oxygen sensors 136, 138 are shown schematically and located in the first and second common exhaust lines 36, 50. The sensor 136 is located downstream of all of the individual exhaust lines 34 from the vacuum pumping arrangements to the first common exhaust line 36. The sensor 138 is located downstream of all of the individual exhaust lines 48 from the vacuum pumping arrangements to the second common exhaust line 50. Other embodiments may comprise similarly arranged oxygen sensors.

Since air flow 70 comprises oxygen the presently described vacuum pumping systems are configured to resist or prevent significant amounts of air flowing upstream through outlets 82 (or outlets 78) to the oxygen sensors 136, 138 that could otherwise contaminate the integrity of the sensed oxygen content in the process gas flows. In this regard, the location or locations of the oxygen sensors are spaced upstream away from the outlets sufficiently to avoid contamination of the sensors, when taking into account the flow of process gas mixture downstream along the common exhaust lines. Additionally, the geometry of the common exhaust lines, including the orifice size of the outlets 78, 82 is selected to suppress back migration of air to the air flow sensors. In this regard, the geometry of the common exhaust lines may comprise a throttle or orifice through which exhaust gas passes either upstream of the outlets or at the outlets. The orifice disrupts the boundary layer effect whereby velocity of flow is highest in the centre of the ducts and approaches zero at the internal surface of the ducts. Back migration could otherwise potentially occur at the internal surfaces. Additionally, pulsation could increase back migration and the orifice reduces the affect of pulsation.

Figure 3:
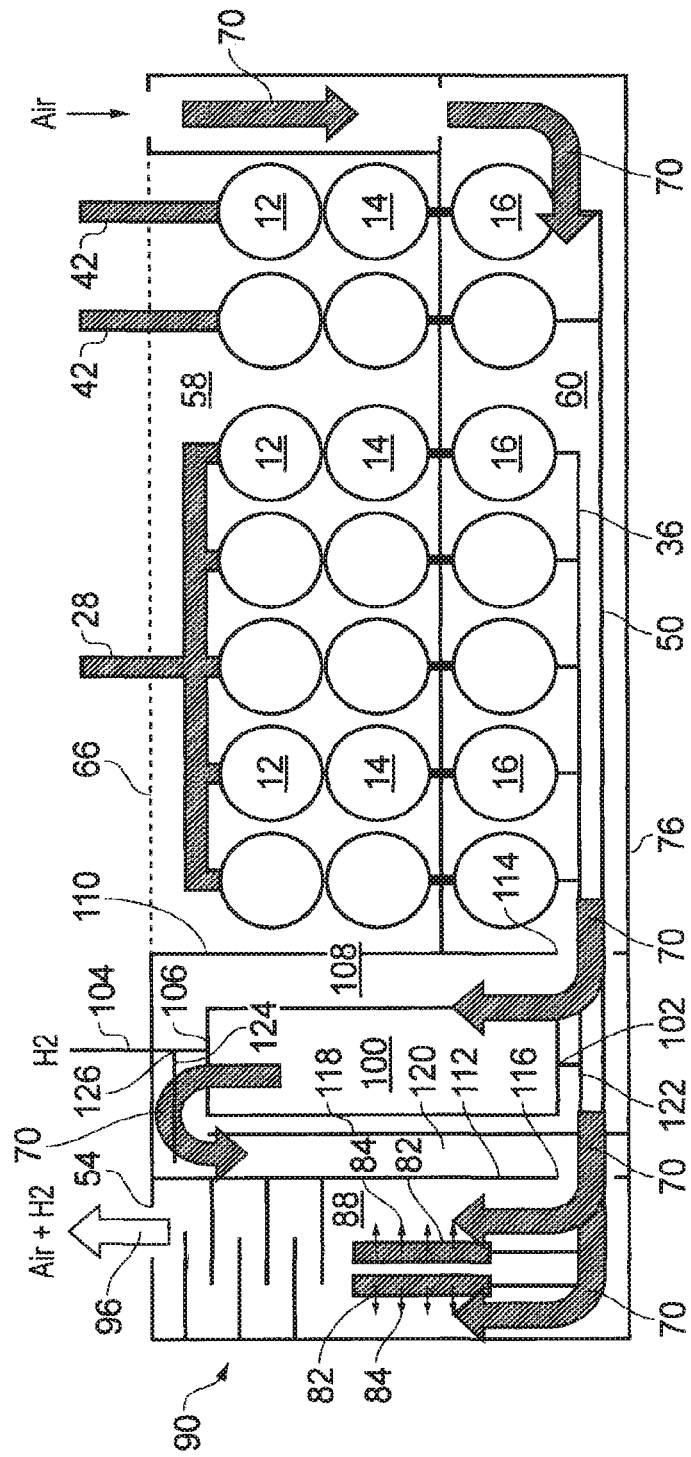
FIG. 3 is a schematic view of another vacuum pumping system.

In a third example of a vacuum pumping system shown in FIG. 3 the system comprises a hydrogen recycling system for recovering hydrogen for use by the source or otherwise. This example is modified from the example shown in FIG. 2 as described below. The similarities between FIGS. 1 and 2, and FIG. 3 will not be described again to avoid repetition.

Referring to FIG. 3, the vacuum pumping system comprises a hydrogen recovery system (HRS) 100. Other pumped gases may be recycled as appropriate but FIG. 3 refers to hydrogen recovery, particularly for use in an EUV apparatus.

The HRS has an inlet 102 for receiving hydrogen from the first common exhaust line 36. The pumped gas may contain nitrogen and other impurities as well as hydrogen and the HRS is arranged to remove the impurities from the gas stream. Although not shown the HRS may be arranged to receive pumped gas from the second common exhaust line, but at least in the present example the flow of hydrogen from the exposure along inlets 42 is far less than from the source so recycling of the second common exhaust line is not used in this implementation.

The first common exhaust line selectively conveys the exhaust gas stream to the inlet 102 of the HRS 100 or to the exhaust outlets 82. At this part of the system the gas stream is at approximately atmospheric pressure. The pumped gas exhaust from the vacuum pumping stacks 12, 14, 16 along the first common exhaust line 36 contains hydrogen, evacuated from the source in the case of an EUV apparatus, and nitrogen to improve pumping in a ratio of about 1:1 by volume. The HRS removes the nitrogen and other impurities from the gas stream to recycle high purity hydrogen to the source or otherwise along recycling line 104 extending from outlet 106. The mechanism of hydrogen recovery systems are known to the skilled person and need not be described in this application.

The housing 56 comprises an enclosure 108 for housing the HRS 100. The enclosure has an inlet and outlet for directing the air flow 70 through the enclosure for capturing in the air stream leakages of hydrogen. Preferably, as shown, the air flow 70 envelops the HRS and the inlet and outlet lines to and from the HRS. The enclosure is formed by lower part 76, upper part 66, and side parts 110, 112. An opening 114 forms an inlet to the enclosure 108 for the air flow and an opening 116 forms an outlet from the enclosure. A partition 118 forms an air flow conduit 120 for conveying air flow from an outlet side of the HRS to the enclosure 88, through air outlet 116.

The example shown in FIG. 3 also comprises an arrangement for venting low purity hydrogen in the event of failure of the HRS 100. If the HRS is functioning within parameters the exhaust gas stream is conveyed to the inlet 102 of the HRS 100 or if the HRS is not functioning within parameters the exhaust gas stream is conveyed to the exhaust outlets 82. A valve 122 may be provided for selectively conveying the exhaust gas stream in this manner. Similarly, the outlet of the HRS is provided with a venting duct 124 for venting impure hydrogen if the HRS is not functioning within parameters. The air flow 70 captures leaked hydrogen by enveloping the venting duct. A valve 126 may be provided for selectively conveying outlet gas from the HRS through outlet duct 104 or venting duct 124.

An aspect of the embodiments is safely conveying a flammable gas such as hydrogen from its vacuum pumping arrangements to an outlet of the system. As part of describing this aspect reference will be made to FIG. 2, in particular, but it will be appreciated that this description applies equally to the other embodiments and modifications.

In the case of hydrogen the lower flammability limit is 4% in dry air, but the limit will differ with other flammable gases. Safety standards require dilution to percentages to lower than the lower flammability limit. Additionally, it is preferable to use ambient air for dilution and the constituents of ambient air may be unknown or inconsistent, particularly with regard to the presence of moisture. Therefore whilst the LFL, of hydrogen in air is 4% it is preferable to dilute the hydrogen gas stream to a quarter of its LFL in air, which is 1%. However, other percentages may be selected dependent on requirements.

If the hydrogen gas stream mixture exhausted is 400 standard litres per minute the flow of air is 400×100=40,000 standard litres per minute for dilution of the hydrogen to 1% in air. It is a simple matter to determine other percentages of flammable gas in a diluting gas, dependent on safety factors or other requirements.

In the present case, nitrogen is introduced to the pumped gas flow to improve pumping and therefore the introduction of nitrogen in itself reduces the subsequent percentage of hydrogen in the air flow so that the volumetric requirement of air flow can be reduced.

The amount of flammable gas evacuated by the vacuum pumping system may be determined or measured upstream of the system or may be measured by sensors within the vacuum pumping system (for example 400 slm). The vacuum pumping system is arranged to receive a signal from the processing tool and to control air flow dependent on the received signal. Alternatively, the flammable gas flow can be input manually by an operative. However, it is preferable that the maximum flow of flammable gas is determined corresponding to the process and that the air flow provided is maintained at a level which is sufficient to dilute safely that maximum flow, and that the air flow continues at that level even if flow of flammable gas is temporarily reduced during or between processing.

Over and above the determined flow of flammable gas, the system comprises one or more arrangements for determining or measuring the air flow 70 to ensure that it is sufficient to dilute safely the determined flammable gas flow. Dependent on the measured air flow a signal is emitted relating to whether abatement is OK or not OK so that the tool can determine if processing may be continued.

Air flow can be determined in any suitable way, for example by measuring the energy consumed by the fan 77, although in some circumstances this approach is not reliable. The vacuum pumping system comprises in these examples and as shown in FIG. 2 a sensor 130, shown schematically, for sensing the amount of air flow 70, preferably volumetric air flow over time. The sensor is preferably arranged to determine a pressure difference upstream and downstream of an orifice 131 to provide an air flow determination. The sensor is arranged to output a signal corresponding to the air flow over a control line to a control 132. The control determines if the amount of air flow is sufficient for the required dilution of the pumped gas flow. If the air flow is not sufficient, the air flow can be increased or the pumped gas stream may be diverted to another abatement system, such as a burner. The control in this example is connected to a processing tool to output an abatement OK signal (or an abatement not OK) signal so that appropriate action can be implemented dependent on the sensed airflow, such as termination of flammable gas flow to the process tool.

The control may comprise a digital processor for comparing the air flow signal received from the or each sensor with a predetermined air flow and outputting an abatement signal corresponding to the state of the abatement, such as a binary '1' when abatement is within safe parameters and a binary '0' when abatement is not within safe parameters. The control may be a computer or a bespoke processing component.

A secondary air flow sensor 134 (corresponding in functionality to sensor 130) may be provided as shown for sensing air flow at another portion of the path 70. The secondary air flow sensor is connected by a control line (not shown) to convey signals to the control 132. In this case, the sensor is positioned downstream of region 60. The secondary sensor performs a back-up or diversified determination of air flow and additionally allows a determination of leakage of pumped gas captured by the air flow 70. If the leakage detected is abnormally high or above parameters, the air flow can be increased or the pumped gas stream can be diverted to another abatement system, such as a burner.

Referring to FIG. 2, the enclosed volume 58 contains those parts of the pumping arrangement at which the pumped gas is at low pressure, or pressure less than atmosphere. In an EUV application this pressure may be about 1 mbar, particularly in the present example where pumps 12, 14 are high capacity low compression booster pumps. The volume 58 is maintained at atmosphere and therefore leakages from the pumping line are minimal because of the pressure differential. Volume 58 contains those parts which may inadvertently provide an ignition source, such as motors for the vacuum pumps or drives for the motors.

However, in volume 60 pressure of the pumping line is at or approaches atmosphere and therefore leakages become more of a problem, since the pressure gradient is reduced. The air flow 70 causes leakages of flammable gas to be captured and diluted without causing a safety risk, to proportions lower than the lower flammability limit. FIG. 2 shows schematically the air flow in region 60 for simplicity, but in practice the air flow is directed to those parts in the region which have been determined are prone to leakage, for example joints connecting forelines or exhaust ducts to vacuum pumps.

Air flow may be determined at locations known to be prone to leakage or accumulations of gas, in experimentation prior to use or in real time during use. Such determinations may take the form for example of changes in air over time or face velocity of air flow. Standards apply to these changes in air over time and face velocity measurements and known sensors, such as anemometers, may be used as appropriate. Where it is determined by experimentation that specific volumes or spaces are prone to leakage or accumulation, the air flow path 70 is arranged to direct flow to those volumes or spaces for example by vanes or ducting. For example as shown in FIG. 2, if there is potential leakage at connection 150 between the exhaust lines and the vacuum pumping arrangements, the second region is configured (e.g. with vanes 152) for directing air flow for diluting leaked flammable gas at that part of the second region.

The selection of components avoids the occurrence of ignition points. Ignition points may occur by components used for electrical switching and in this regard, motors and drive circuitry are located in region 58 where there is little if any significant leakage out of the pumps. The air flow duct is configured to dilute leakage out risk points in region 60 sufficiently, but as a further safety precaution, energy levels in region 60 are maintained below those that could potentially cause sufficient transfer of energy to a flammable gas mixture and energy limiters may be adopted where appropriate. For example, pumps 16 comprise a motor and drive circuitry and these are contained in terminal boxes. The configuration of the duct causes air flow to be directed at and around the terminal boxes so that the adjacent volume is maintained at percentages lower than the lower flammability limit. The terminal boxes may as a precaution be flame proof or may be purged and pressurised.

As described in EUV applications the vacuum pumping system pumps elemental hydrogen and Stannane (Tin Hydride). Stannane is exhaust by the common exhaust lines it can be swept into the air flow 70 and emitted from the system, potentially causing environmental contamination. In the present embodiments one or more Tin traps are provided for capturing Tin from pumped Stannane. In this regard, substrates or surfaces are provided along the pumped flow path on which Tin can decompose from the Stannane and deposit. As shown in FIG. 2 the tin traps 140 (shown schematically) provide surfaces on which Tin can deposit and in this example are located to receive gas from the pumped flow path between the second vacuum pump 14 and the third vacuum pump 16. The Tin traps may be located in other positions to receive gas from the upstream apparatus. In an arrangement (not shown) the forelines 32 may be formed by a manifold which conveys gas from the outlets of the upstream pumps to the outlets of the downstream pumps and the manifold may comprise the Tin traps. In a further arrangement (not shown) the depositing surfaces of the Tin traps are heated to promote decomposition and depositing.

Figure 4:
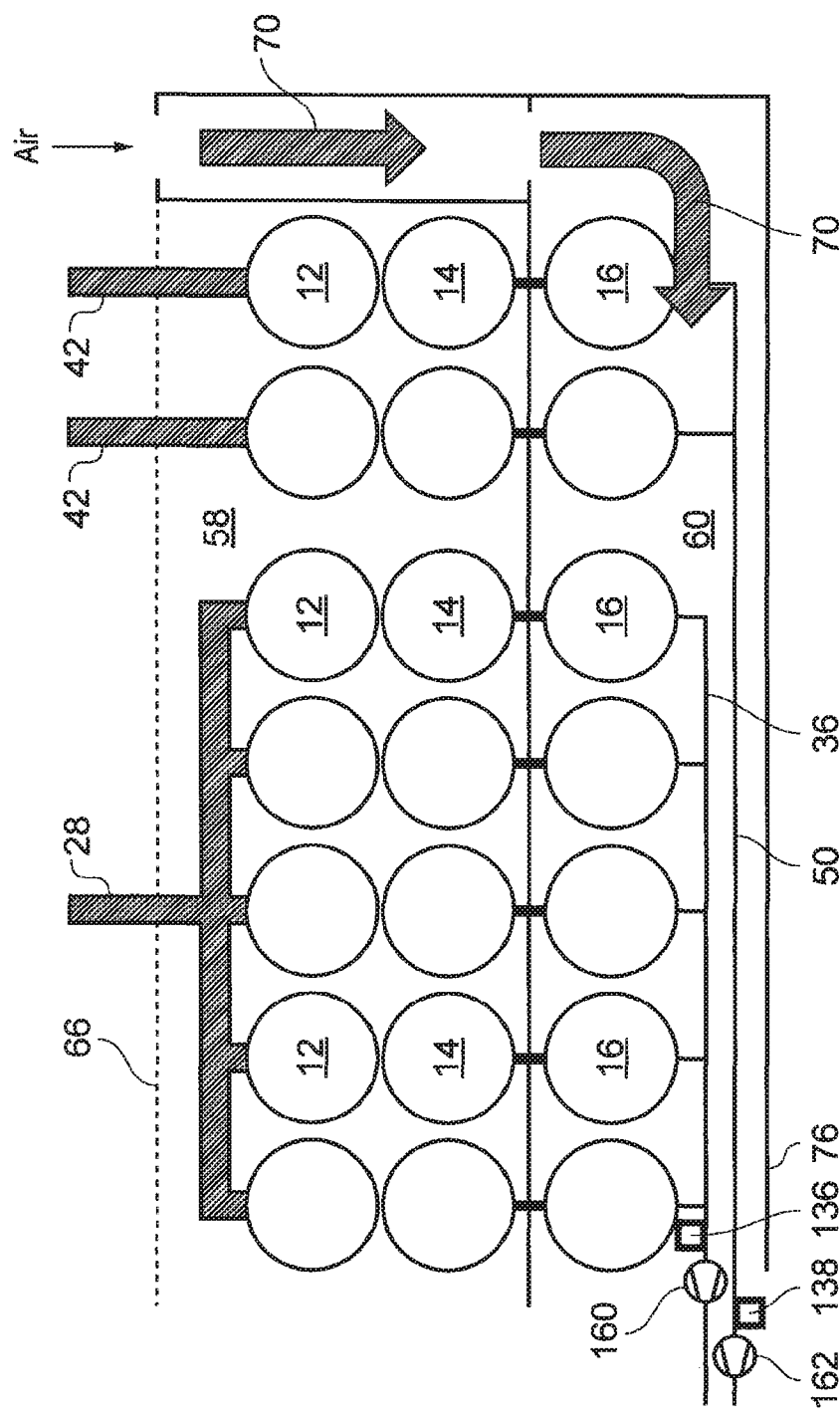
FIG. 4 is a schematic view of part of a modified vacuum pumping system.

FIG. 4 shows a modification of the earlier embodiments. The rest of the system is similar to those described above and will not be described again. FIG. 4 shows only that part of the system necessary to enable explanation of the modification.

A first common vacuum pump 160 is provided for pumping the first common exhaust line 36 and preferably also or alternatively a second common vacuum pump 162 is provided for pumping the second common exhaust line 50. These vacuum pumps cause compression of the gas stream flowing through the common exhaust lines. This compression reduces the pressure at the exhausts of the vacuum pumps 16. A reduced exhaust pressure may be useful where the vacuum pumps generate sufficient heat that an external housing or casing of the vacuum pumps approaches or exceeds energy levels sufficient to constitute a source of ignition. By reducing the exhaust pressures, the work done by the vacuum pumps is reduced which in turn lowers the amount of heat generated by the pumps.

The vacuum pumps 160, 162 are preferably configured for a compression ratio of around 2:1 causing compression from around 500 mbar at the inlets to around atmosphere at the exhausts.

Where the system comprises an oxygen sensor (as described above—see numerals 136, 138 in FIG. 2) and the oxygen sensor or sensors are located upstream of the vacuum pumps 160, 162, as shown in this example, the oxygen sensors are configured to operate at a pressure less than atmosphere, for example at 500 mbar, for sensing the oxygen content of the exhaust gas stream conveyed along the first and second common exhaust lines. Location of the oxygen sensors upstream of the vacuum pumps 160, 162 isolates the sensors from downstream migration of air from the gas outlets 78, although in other examples the oxygen sensors may be located upstream of the vacuum pumps.

Figure 5:
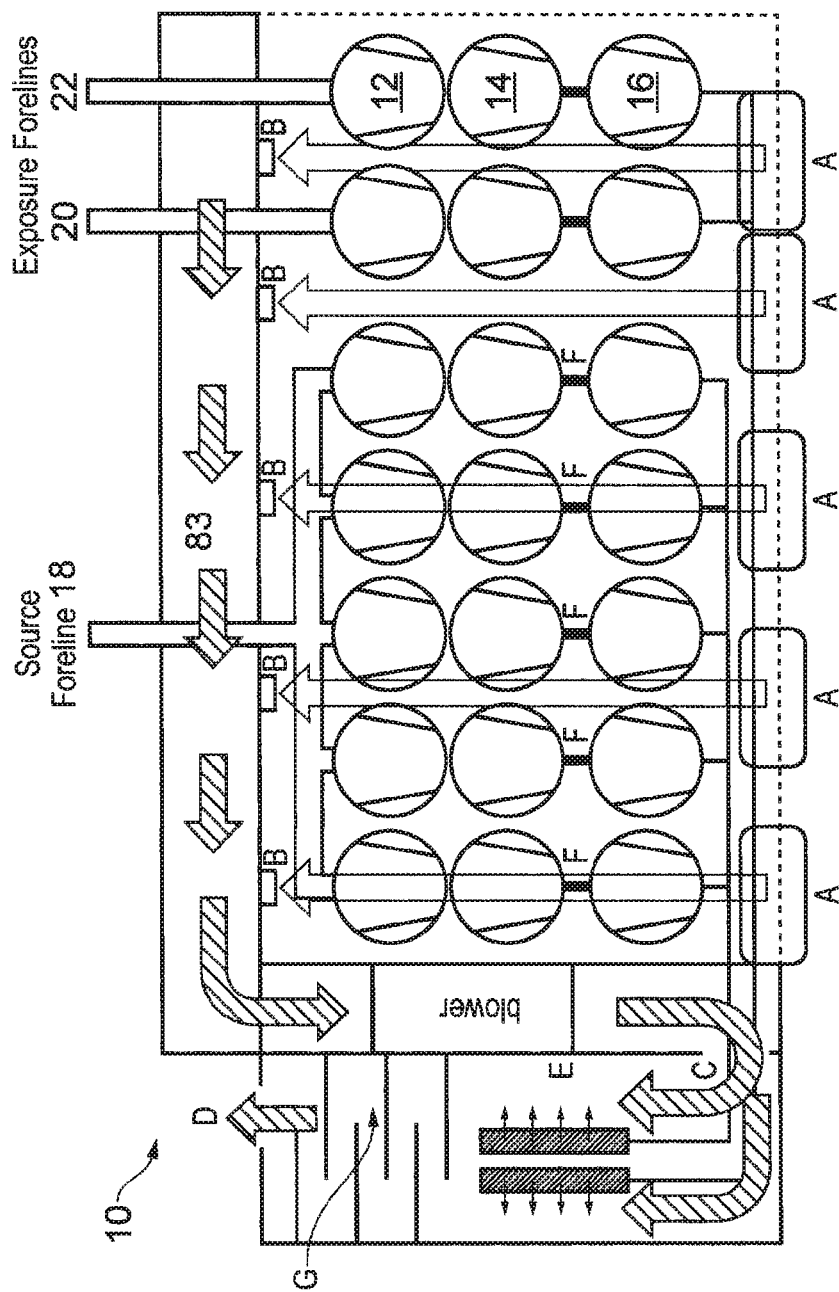
FIG. 5 is a schematic view of a further vacuum pumping system.

FIG. 5 shows a vacuum pumping system 10 according to a further embodiment. This system is similar to that of FIGS. 1 and 2, but differs in that the air flow over the pumping arrangements is directed to flow over all of the pumps from an inlet adjacent to the downstream pump to an outlet adjacent to the upstream pumps. This flow arrangement allows independent maintenance of each pumping stack. In this embodiment, the housing may be opened and the air flow may still be sucked in from the clean room via inlets A and pass over the pumps to orifices B.

As for FIGS. 1 to 4, in this embodiment, the vacuum pumping system 10 may comprise a single vacuum pumping arrangement or a plurality of vacuum pumping arrangements. In the illustrated example there are seven vacuum pumping arrangements shown. Each vacuum pumping arrangement may comprise a single vacuum pump or more than one pump configured in series and/or parallel. In the illustration, each vacuum pumping arrangement comprises three pumps in series 12, 14, 16. The pump or pumps selected may comprise without limitation any one or more of the following vacuum pumping mechanisms: turbo molecular, drag, scroll, screw, roots, claw or rotary vane.

In the example of FIG. 5 for an EUV apparatus, the vacuum pumping arrangements comprise in series two booster pumps 12, 14, and a primary (or backing) pump 16. The primary pump is a compression pump configured for generating a significant portion of the required vacuum pressure in the upstream source, which is typically in the region of 1 mbar, and the booster pumps are configured for generating the required volumetric flow, which for a source is in the region of 100 slm per tool. In this example, the booster pumps 12, 14 comprise roots type mechanisms and the primary pump comprises a claw type mechanism. There are many other pump configurations and arrangements that could be used depending on the flow and pressure required.

In FIG. 5 the vacuum pumping arrangements are grouped to evacuate three pumped gases 18, 20, 22. In other examples the vacuum pumping system is arranged to evacuate fewer or more than three pumped gas flows. In an EUV fabrication facility, the process gas flow 18 is the source and the process gas flows 20, 22 are the exposure, or scanner. There may be one or more source chambers and one or more exposure chambers.

A first group of a plurality of vacuum pumping arrangements is configured for evacuating gas flow 18. Five vacuum pumping arrangements are shown in FIG. 5 for doing this. The vacuum pumping arrangements are arranged in parallel and each comprises three vacuum pumps 12, 14, 16 in series. A manifold conveys process gas received by an inlet line from one or more source tools to inlets of the first pumps 12 of the vacuum pumping arrangements. Gas is pumped by first pumps 12 and second pumps 14 and forelines convey gas from the exhausts of the second pumps to an inlet of the third pumps 16. The third pumps pump gas to exhausts that are connected by exhaust lines to a first common exhaust line.

Further vacuum pumping arrangements are arranged to evacuate respective process gas flows 20, 22, which in the example of a EUV apparatus are from respective exposure apparatus. Each of these vacuum pumping arrangements comprises three vacuum pumps 12, 14, 16 in series. Exhaust lines convey gas from the exhausts of vacuum pumps 16 to a second common exhaust line.

The first and second common exhaust lines convey gas to be expelled from the system 10 through opening C.

The vacuum pumping system 10 comprises a housing. The housing houses the vacuum pumping arrangements, pumps 12, 14 and 16 and also the air flow passage 83.

Housing has a plurality of air inlets A that admit air adjacent to the downstream pumps 16, the air flows over the pumps, 16, 14, 12 and out through orifices B. There are Tin traps located at F. The orifices B may in some embodiments be controllable orifices such that the air flow through each orifice may be controlled. Control of the flow through the different orifices allows the flow to be evenly distributed across the different pumps. In some embodiments there may be more inlets A than outlets B and this may provide a more balanced flow.

The air flows out through orifices B along air flow passage 83, through the blower and into the mixing region via outlet C. In some embodiments there are air flow sensors at each orifice B, and a further air flow sensor may be found at orifice C. The air flow sensors at C allow the overall air flow to be sensed and then controlled by control circuitry controlling the blower. The distribution of the air flow over the pumps may also be sensed and controlled using the multiple air flow sensors at orificies B. In this case, the control circuitry determines the distribution of the air flow from the different readings at the air flow sensors at B and controls the size of the orifices in response to the signals. The blower may be located at a different position such as adjacent to exhaust D, or there may be no blower, the air flow being generated by the pull of the duct to which D connects. In some embodiments there may be a Hydrogen sensor at the discharge to the duct D.

The mixing region comprises exhaust outlets in a silencer/diffuser E from the first and second common exhaust lines for exhausting pumped gas. The arrangement of these outlets with the flow of air causes mixing of the pumped gas with the air to avoid concentrations of hydrogen above its lower flammability limit. In the illustration, the exhaust outlets F are spaced upstream from outlet D of the housing with respect to the direction of the flow path sufficiently to allow gas mixing in region prior to emission from the housing through the opening D. Depending on the flow rates of pumped gas and air, this arrangement causes mixing of gases so that the pumped gas has a percentage in air below its lower flammability limit. In the case of hydrogen, which is a highly dispersive gas, the region may be as little as a one or two metres for mixing to be achieved prior to release, although in practice the pipe length may be more than five metres for a chimney.

The air flow is arranged to flow in close proximity to the exhaust outlets and advantageously in a direction which is generally transverse or perpendicular to pumped gas flow to promote diffusion, mixing and dispersion of the process gas in the air flow in mixing region.

A baffle arrangement G causes further mixing of the pumped gas with the air. Mixed gas is emitted from the housing through opening D.

In addition to, or as an alternative to a baffle arrangement, other types of mixing arrangement may be incorporated in the vacuum pumping system. For example, the pumped gas may be passed through a throttle or restricted orifice, whereby the pumped gas subsequently expands and disperses into the air flow.

The mixing method and chamber adopted is free of potential sources of ignition at least in those regions where there is a possibility that the flammable pumped gas is at a percentage in air above its lower flammability limit.

Figure 6:
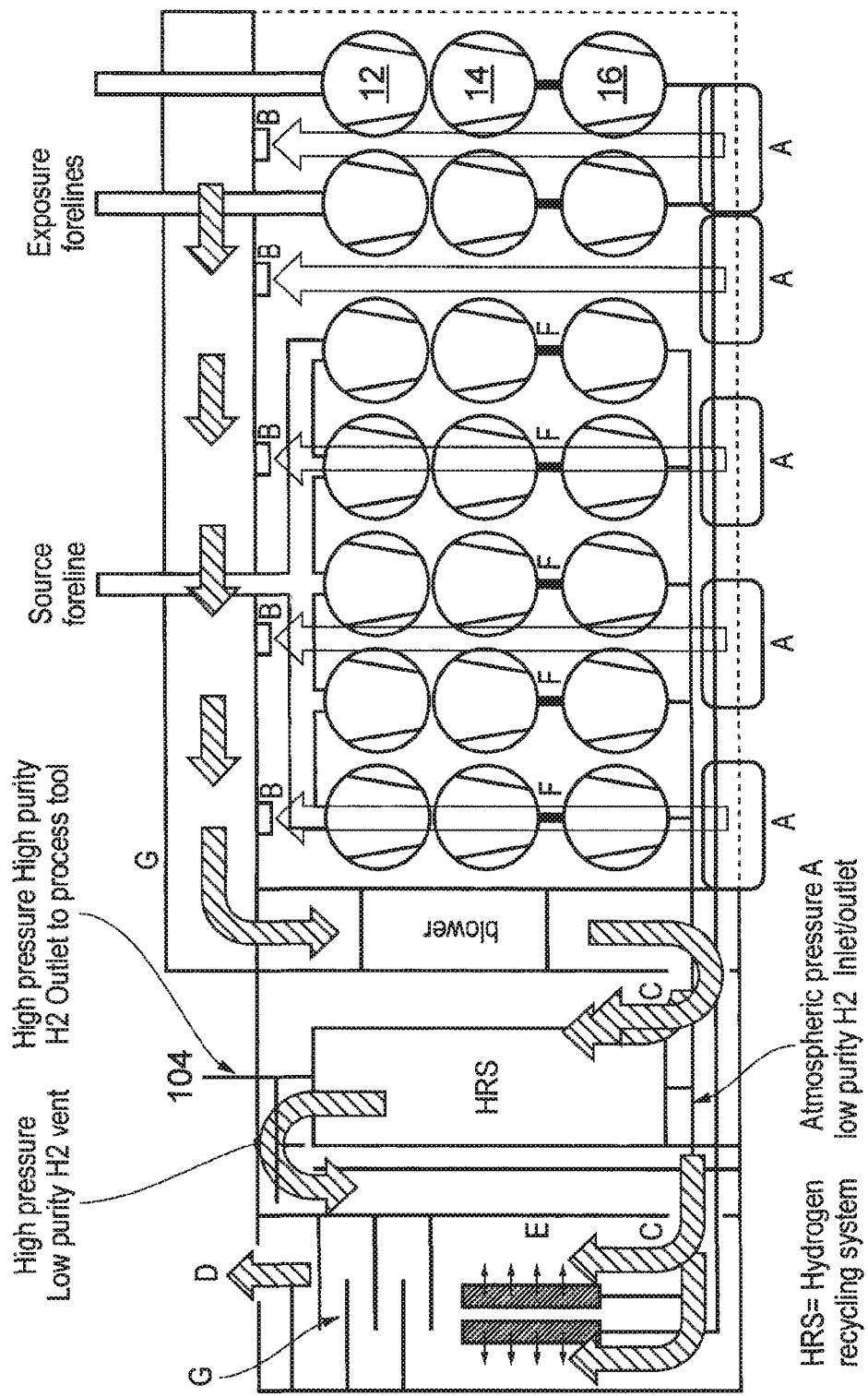
FIG. 6 is a schematic view of the vacuum pumping system of FIG. 5 with a hydrogen recovery system.

In a further example of a vacuum pumping system shown in FIG. 6 the system comprises a hydrogen recycling system for recovering hydrogen for use by the source or otherwise. This example is modified from the example shown in FIG. 5 as described below.

Referring to FIG. 6, the vacuum pumping system comprises a hydrogen recovery system (HRS). Other pumped gases may be recycled as appropriate but FIG. 6 refers to hydrogen recovery, particularly for use in an EUV apparatus.

The HRS has an inlet for receiving hydrogen from the first common exhaust line. The pumped gas may contain nitrogen and other impurities as well as hydrogen and the HRS is arranged to remove the impurities from the gas stream. Although not shown the HRS may be arranged to receive pumped gas from the second common exhaust line, but this is not used in this implementation.

The first common exhaust line selectively conveys the exhaust gas stream to the inlet of the HRS or to the exhaust outlets E. At this part of the system the gas stream is at approximately atmospheric pressure. The pumped gas exhaust from the vacuum pumping stacks 12, 14, 16 along the first common exhaust line contains hydrogen, evacuated from the source in the case of an RN apparatus, and nitrogen to improve pumping in a ratio of about 1:1 by volume. The HRS removes the nitrogen and other impurities from the gas stream to recycle high purity hydrogen to the source or otherwise along recycling line 104 extending from the outlet.

The HRS system is arranged for air flow in a similar way to that of FIG. 3 and will not be described in more detail here.

In summary FIGS. 1 to 4, show the air flow being drawn horizontally across the system, and being directed to pass across the lowest level of pumps in each stack in series before meeting the hydrogen. This has the advantage of providing sufficient air flow to dilute a full leak at any point where it could possibly leak out of the pumps (i.e. the atmospheric pressure end of the pumps).

FIGS. 5 to 6 show a system where the air flow is routed from several inlets distributed along the lower part of the enclosure and therefore creating parallel vertical air streams drawn out at the top. The advantage of this scheme is that it is easier to implement on a design and allows maintenance/repair/replacement work to be done on any stack whilst still allowing the EUV tool to run hydrogen. This is a key requirement for EUV (to meet the availability target).

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A vacuum pumping system comprising:
   a plurality of vacuum pumping arrangements for evacuating a flammable gas and exhausting an exhaust gas stream through one or more exhaust outlets;
   a housing for housing the vacuum pumping arrangements and forming an air flow duct for an air flow for mixing with the exhaust gas stream output from the one or more exhaust outlets in a mixing region in the housing;
   an airflow generator for generating an air flow through the air flow duct to cause mixing of air with the exhaust gas stream to a percentage of the flammable gas in the air flow lower than the lower flammability limit of the flammable gas; and
   an air flow sensor for sensing the flow of air for determining if the air flow is sufficient to dilute the flammable gas to lower than said percentage.

2. The vacuum pumping system as claimed in claim 1, wherein the housing comprises a first region comprising portions of the vacuum pumping arrangements pumping at a pressure lower than atmosphere and a second region comprising portions of the vacuum pumping arrangements pumping at a pressure higher than the portions of the vacuum pumping arrangements in the first region and the air flow duct is formed by the second region.

3. The vacuum pumping system as claimed in claim 1, wherein each vacuum pumping arrangement comprises a series of vacuum pumps comprising at least one upstream vacuum pump and at least one downstream vacuum pump and a first region of the housing houses the upstream vacuum pumps and a second region of the housing houses the downstream vacuum pumps.

4. The vacuum pumping system as claimed in claim 3, wherein a portion of the air flow duct is formed by the second region.

5. The vacuum pumping system according to claim 1, wherein each of the plurality of vacuum pumping arrangements comprise a downstream vacuum pump and an upstream vacuum pump within a vacuum pumping region, said vacuum pumping region comprising said air flow duct and comprising a plurality of air inlets for admitting air adjacent to the downstream vacuum pumps and a plurality of orifices for outputting air adjacent to the upstream vacuum pumps.

6. The vacuum pumping system according to claim 5, wherein said plurality of orifices are configured to output air flow to an air flow passage, said air flow duct further comprising said air flow passage.

7. The vacuum pumping system according to claim 5, wherein said plurality of orifices comprise controllable orifices configured to vary a diameter of said orifice in response to a control signal.

8. The vacuum pumping system as claimed in claim 1, comprising at least two said air flow sensors.

9. The vacuum pumping system as claimed in claim 8, wherein one of said air flow sensors is upstream of the vacuum pumping arrangement and one is downstream of the vacuum pumping arrangements.

10. The vacuum pumping system as claimed in claim 8, comprising a plurality of air flow sensors each associated with a corresponding one of at least a subset of said plurality of orifices and a further air flow sensor adjacent to the mixing region.

11. The vacuum pumping system as claimed in claim 8, comprising a control and wherein each air flow sensor is configured to output a signal relating to the sensed air flow to the control for determining if the air flow is sufficient to dilute the flammable gas to lower than said percentage.

12. The vacuum pumping system as claimed in claim 1, wherein the housing comprises at least one air inlet and an air outlet for the air flow duct, and the mixing region is located towards the air outlet, the one or more exhaust outlets for the gas stream being located in the mixing region for mixing the air flow with the gas stream prior to passage through the air outlet.

13. The vacuum pumping system as claimed in claim 12, wherein the mixing region spaces the exhaust outlets from the air outlet by a distance sufficient to allow mixing of the flammable gas with the air flow to lower than the lower flammability limit prior to emission through the air outlet.

14. The vacuum pumping system as claimed in claim 12, wherein the mixing region comprises a baffle arrangement for mixing the flammable gas with the air flow.

15. The vacuum pumping system as claimed in claim 12, further comprising a hydrogen recovery system, said hydrogen recovery system being located within the air duct between the vacuum pumping arrangements and said mixing region.

16. The vacuum pumping system as claimed in claim 12, wherein the exhaust outlets are arranged to exhaust the exhaust gas stream in a direction generally transverse to the air flow for dispersing the flammable gas in the air stream.

17. The vacuum pumping system as claimed in claim 1, wherein the air flow duct of the housing is arranged to be free of ignition sources.

18. The vacuum pumping system as claimed in claim 1, wherein the air flow duct is configured for directing air flow proximate leakages of flammable gas.

19. The vacuum pumping system as claimed in claim 1, comprising Tin traps coupled to the plurality of vacuum pumping arrangements for collecting Tin in the gas stream.

20. The vacuum pumping system as claimed in claim 1, comprising at least one sensor for sensing oxygen in the exhaust stream, the sensors being located downstream of the vacuum pumping arrangements with respect to flow of the gas stream and upstream of the one or more exhaust outlets with respect to the air flow sufficiently to prevent oxygen in the air flow migrating upstream through the exhaust outlets to the oxygen sensors.

21. The vacuum pumping system as claimed in claim 1, comprising a hydrogen recovery system for receiving the gas stream from the vacuum pumping arrangements and recovering hydrogen from the gas stream, wherein the air flow duct is arranged for ducting air flow around the hydrogen recovery system for diluting leakages of hydrogen.

22. A vacuum pumping system comprising:
a plurality of vacuum pumping arrangements for evacuating a flammable gas stream and exhausting an exhaust gas stream through one or more exhaust outlets;
a housing for housing the vacuum pumping arrangements and forming an air flow duct for an air flow for mixing with the exhaust gas stream output from the one or more exhaust outlets in a mixing region in the housing;
a common exhaust line connected for receiving gas from the plurality of vacuum pumping arrangements;
an airflow generator for generating an air flow through the air flow duct to cause mixing of air with the exhaust gas stream to a percentage of the flammable gas in the air flow lower than the lower flammability limit of the flammable gas; and
an air flow sensor for sensing the flow of air for determining if the air flow is sufficient to dilute the flammable gas to lower than said percentage.

23. The vacuum pumping system as claimed in claim 22, further comprising a common vacuum pump for pumping gas conveyed along the common exhaust line for reducing pressure at the exhausts of the vacuum pumping arrangements.

24. The vacuum pumping system as claimed in claim 23, wherein an oxygen sensor is located for sensing oxygen content of the gas stream in the common exhaust line upstream of the common vacuum pump at a pressure less than atmosphere.

* * * * *